United States Patent [19]

Mitsutsuka

[11] Patent Number: 5,226,004
[45] Date of Patent: Jul. 6, 1993

[54] SURFACE ACOUSTIC WAVE FILTER DEVICE

[75] Inventor: Syuichi Mitsutsuka, Tokyo, Japan
[73] Assignee: Clarion Co., Ltd., Tokyo, Japan
[21] Appl. No.: 780,970
[22] Filed: Oct. 23, 1991

[30] Foreign Application Priority Data

Oct. 26, 1990 [JP]  Japan ................... 2-290444

[51] Int. Cl.$^5$ ............................................ G06G 7/12
[52] U.S. Cl. ....................................................... 364/821
[58] Field of Search ............... 364/819, 821, 728.01, 364/728.02, 728.03; 375/1, 96

[56] References Cited

U.S. PATENT DOCUMENTS

| | | | |
|---|---|---|---|
| 4,224,683 | 9/1980 | Adkins ................................. | 364/821 |
| 4,691,326 | 9/1987 | Tsuchiya ............................. | 375/1 |
| 5,045,743 | 9/1991 | Furukawa ........................... | 364/821 |

FOREIGN PATENT DOCUMENTS

2305036  12/1990  Japan ................ 364/728.01

*Primary Examiner*—Jerry Smith
*Assistant Examiner*—Chuong D. Ngo
*Attorney, Agent, or Firm*—Flynn, Thiel, Boutell & Tanis

[57] ABSTRACT

A surface acoustic wave filter device includes a plurality of surface acoustic wave convolvers each having an output electrode between two input transducers, one of the input transducers of each convolver receiving a reference signal through a respective matching circuit. The other input transducer of one of the convolvers receives an input signal through a matching circuit, and the other input transducer of the rest of the convolvers receives through a respective input matching circuit and low pass filter from a respective mixing circuit a mixture of the reference signal and a respective output signal received from the output of a respective output matching circuit having an input coupled to the output electrode of a respective convolver. The remaining convolver has an output electrode coupled to a further output matching circuit. In one embodiment, a low pass filter receives from a mixing circuit a mixture of the reference signal and the output from the further output matching circuit. In a variation, the output of the further output matching circuit is connected to a detecting circuit.

10 Claims, 7 Drawing Sheets

SURFACE ACOUSTIC WAVE FILTER DEVICE

FIELD OF THE INVENTION

The present invention relates to an improvement of a filter having a variable central frequency formed by using surface acoustic wave (hereinbelow abbreviated to SAW) convolvers.

BACKGROUND OF THE INVENTION

An SAW convolver receives two input signals S(t) and R(t) and outputs an output signal C(t) given by a following formula:

$$C(t) = \eta \int_{t-T}^{t} S(\tau) \cdot R(2t - T - \tau) d\tau$$

where t represents the time, T indicates the gate delay time of the convolver, and n is a constant proportional to the convolution efficiency of the convolver.

In almost all the cases the SAW convolver is used usually as a correlator, using the operational function represented by the above formula, and it is applied often in a spread spectrum communication device, a radar, etc.

However, using the operational function represented by the above formula, the SAW convolver can be used also as a band pass filter having a variable central frequency, an AM or FM demodulator, or a simple spectrum analyzer.

Figure 6:
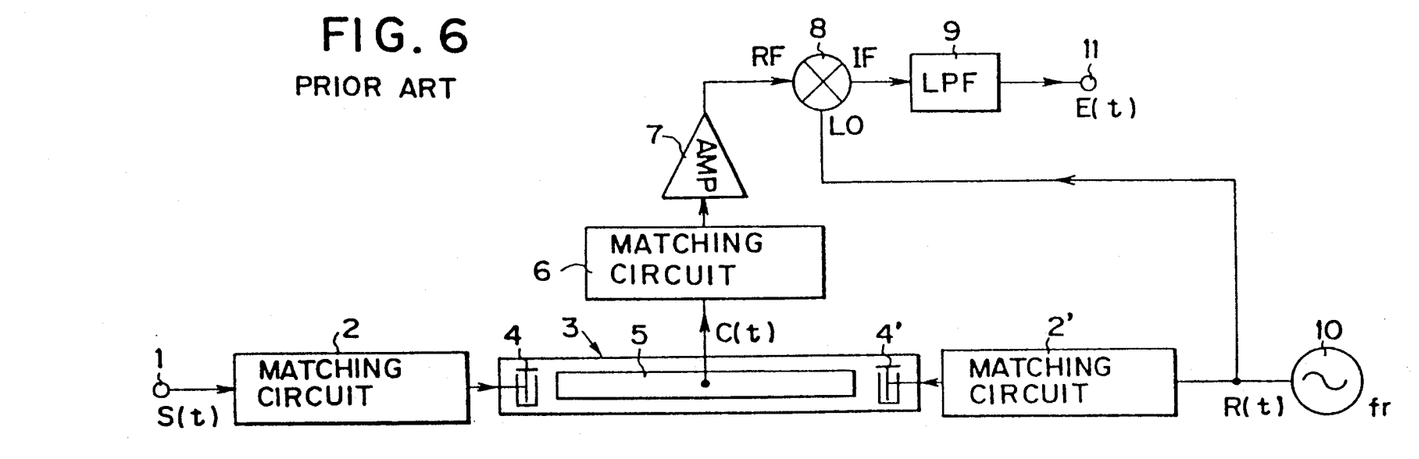
FIGS. 6 and 7 are block diagrams showing different prior art SAW devices.
Figure 7:
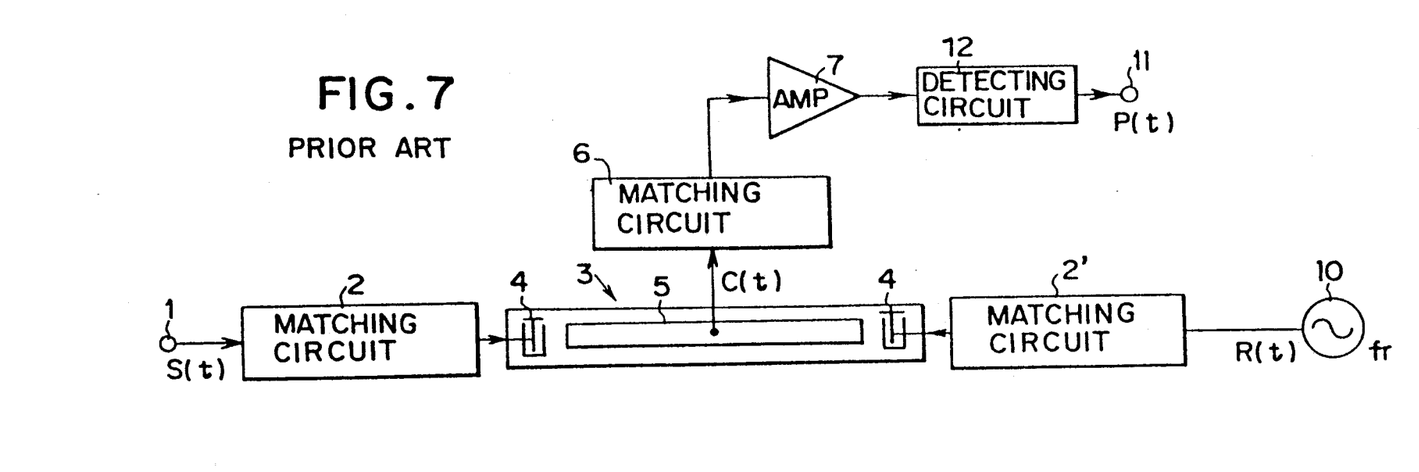

FIGS. 6 and 7 indicate prior art examples for realizing the applications described above.

FIG. 6 shows a prior art example, in which an SAW convolver is used as a band pass filter having a variable central frequency, while FIG. 7 shows a prior art example, in which an SAW convolver is used as an AM or FM demodulator or a simple spectrum analyzer.

In FIGS. 6 and 7, reference numeral 1 is an input terminal; 2 and 2' are input matching circuits; 3 is an SAW convolver; 4 and 4' are input transducers; 5 is an output electrode (gate); 6 is an output matching circuit; 7 is an amplifier; 8 is a mixer; 9 is a low pass filter; 10 is a reference signal generator; 11 is an output terminal; and 12 is a detecting circuit. When the frequency pass band of the two input transducers 4 and 4' formed in the SAW convolver is represented by;

$$f_L \sim f_H (f_L < f_H) \quad (1),$$

the frequency region, which can be matched by the output matching circuit 6, is set at;

$$2 f_L \sim 2 f_H \quad (2).$$

On the other hand the reference signal R(t) outputted by the reference signal generator 10 is a sinusoidal wave of frequency $f_r$, which is expressed by;

$$R(t) = R_o \cos(2\pi f_r t + \theta_r) \quad (3),$$

where $R_o$ represents the amplitude; t the time; and $\theta_r$ the initial phase, and the frequency $f_r$ is chosen in a following domain;

$$f_L \leq f_r \leq f_H \quad (4).$$

Further, in FIG. 6, a signal obtained by amplifying the output of the convolver inputted in an RF terminal of the mixer 8, while the reference signal R(t) is inputted in an LO (Local) terminal. The output from an IF terminal is subjected to filtering in the low pass filter 9 to form an output E(t).

Here it is supposed that the cut-off frequency of the low pass filter 9 described above is $f_H$. That is, the filtering is so set that only the frequency component given by;

$$f \leq f_H \quad (5)$$

is made pass therethrough.

On the other hand, in FIG. 7, the output of the convolver 3 amplified by the amplifier 7 is detected by the detecting circuit 12 and the output after the detection is the output of the whole P(t). Here the detecting circuit 12 is a detecting circuit, which is constructed so as to output a signal proportional to the amplitude of the input signal.

Now, in the prior art SAW filter devices indicated in FIGS. 6 and 7 and constructed as described above, when the input signal S(t) is a sinusoidal wave of frequency f expressed by;

$$S(t) = S_o \cos(2\pi f t) \quad (6),$$

where $S_o$ represents the amplitude, the output E(t) in FIG. 6 and the output P(t) in FIG. 7 can be expressed as follows;

$$E(t) = A S_0 R_0^2 \cdot \frac{\sin\{\pi(f - f_r)T\}}{\pi \cdot (f - f_r)} \cdot \quad (7)$$

$$\cos\left\{2\pi f\left(t - \frac{T}{2}\right) + \theta(f) + \theta_r\right\}$$

$$P(t) = B S_0 R_0 \left| \frac{\sin\{\pi(f - f_r)T\}}{\pi \cdot (f - f_r)} \right|. \quad (8)$$

In Eq. (7), A is a constant determined by the efficiency of the convolvers 3, the gain of the amplifiers 7 and the efficiency of the mixers 8 and $\theta(f)$ represents an amount of phase shift determined by phase characteristics of the input and the output matching circuits 2, 2' and 6, the amplifiers 7, the mixer 8 and the low pass filters 9.

On the other hand, in Eq. (8), B is a constant determined by the efficiency of the convolvers 3, the gain of the amplifiers 7 and the efficiency of the detecting circuit 12.

From Eq. (7), it may be obvious that the construction indicated in FIG. 6 can be a band pass filter, whose central frequency is $f_r$. However, from Eq. (7), amplitude characteristics of the filter can be expressed by;

$$|E(t)| \propto \left| \frac{\sin\{\pi(f - f_r)T\}}{\pi \cdot (f - f_r)} \right|. \quad (9)$$

That is, denoting the difference between the frequency f of the input signal and the frequency $f_r$ of the reference frequency by;

$$x \equiv f - f_r \quad (10),$$

the amplitude characteristics of the filter indicated in FIG. 6 are passing characteristics proportional to $$\left|\frac{\sin x}{x}\right|.$$

On the other hand, as clearly seen from Eq.(8), the output in FIG. 7 has a value, which is also proportional to $$\left|\frac{\sin x}{x}\right|.$$

The points described above are explained also e.g. in JP - A - Hei 2-207605 [Reference (1)].

Now, from Eq. (7) and the explanation described above, it may be obvious that the construction indicated in FIG. 6 can be applied as a band pass filter having a variable central frequency ($f_r$) by varying the frequency $f_r$ of the refrence signal in the construction indicated in FIG. 6.

On the other hand, also in the construction indicated in FIG. 7, when the frequency $f_r$ of the reference signal is swept, using Eq. (8), the intensity of the output signal can be expressed by a function of a form of $$\left|\frac{\sin x}{x}\right|.$$

whose central frequency is $f_r$. Therefore it may be obvious that it can be used as a simple spectrum analyzer. Further the construction indicated in FIG. 7 can be used in an AM demodulator or an FM demodulator, utilizing output characteristics of the form of $$\left|\frac{\sin x}{x}\right|.$$

Concerning details thereof, refer to Reference [1] stated previously.

However the prior art devices indicated in FIGS. 6 and 7 as described above have a problem as follows.

As explained in the description after Eq. (10), it is that the level of side lobes is too high, because both the devices indicated in FIGS. 6 and 7 have passing characteristics or output characteristics of the form of $$\left|\frac{\sin x}{x}\right|.$$

Figure 8:
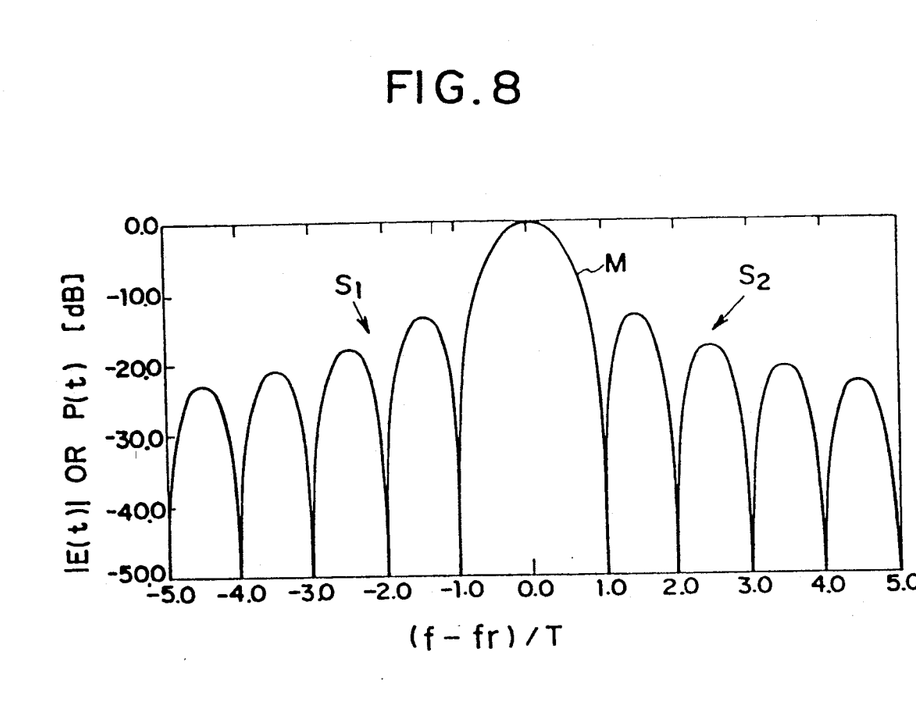
FIG. 8 shows frequency characteristics of the prior art devices.

FIG. 8 indicates amplitude characteristics $|E(t)|$ of the filter indicated in FIG. 6 and frequency characteristics of the output P(t) of the construction indicated in FIG. 7, where the abscissa represents $(f-f_r)/T$ and the ordinate shows the value of $|E(t)|$ or P(t) normalized with respect to the maximum values thereof and f represents the frequency of the input signal; $f_r$ the frequency of the reference signal; and T the gate delay time of the convolver. Here denoting the length of the output electrode of the convolver (gate length) by L and the propagation velocity of the surface acoustic wave by v, a following relation is valid;

$$L = v T \quad (11).$$

It can be seen from FIG. 8 that the maximum value $V_{smax}$ of the side lobes $S_1$ and $S_2$ with respect to the value $V_p$ of the main lobe corresponding to $f=f_r$ is as great as;

$$\frac{V_{smax}}{V_p} \approx -13.269 \text{ dB}. \quad (12)$$

$V_{smax}$ corresponds to the value when the input frequency f is equal to a frequency $f_m$ ($f=f_m$) defined by;

$$\frac{|f_m - f_r|}{T} \approx 1.43. \quad (13)$$

From FIG. 8, the band width of the main lobe M is approximately equal to T (width of 3 dB down). It can be understood that, in order to reduce the band width of the filter or to increase the resolving power in the case where it is applied as a spectrum analyzer, it is sufficient to elongate the gate length L. On the other hand, the maximum value of the side lobes $S_1$ and $S_2$ is expressed by Eq. (12) and independent of the gate length L.

The value of Eq. (12) indicates that there are problems that the side lobe suppressing ratio is too small, in the case where the construction indicated in FIG. 6 is used as a filter and that the spurious level is too high and it is impossible to have a satisfactorily great dynamic range, in the case where the construction indicated in FIG. 7 is used as a spectrum analyzer. The problems described above cannot be solved, even if the gate length L of the convolver is varied, as described above.

That is, the prior art devices indicated in FIGS. 6 and 7 had a drawback that it was not possible to avoid a problem that the side lobe suppressing ratio was small or the dynamic range was narrow in applications thereof to a filter, a spectrum analyzer, etc. in practice.

OBJECT OF THE INVENTION

The object of the present invention is to provide a filter having a variable central frequency formed by using SAW convolvers capable of increasing the side lobe suppressing ratio and enlarging the dynamic range.

SUMMARY OF THE INVENTION

In order to achieve the above object, a first invention of the present application is characterized in that it comprises surface acoustic wave (SAW) convolver means consisting of m SAW convolvers, with each of which two input transducers, to each of which an input matching circuit is connected, and an output matching circuit are connected and each of which includes an output electrodes disposed between the input transducers, the output matching circuit of each stage of the SAW convolvers being connected one after another with one of the input matching circuits of a succeeding stage of the SAW convolvers in series; a reference signal generator for supplying a reference signal to another of the input matching circuits of each of the SAW convolvers; (m−1) first mixers for mixing an output of the output matching circuit and the reference signal and (m−1) first low pass filters, each of which is connected with each of the first mixers, each of them being connected between the output matching circuit and the another of the input matching circuits connected in series of each of the SAW convolvers; a second mixer for mixing the output of the output matching circuit of the last stage of the SAW convolvers and the reference signal; and a second low pass filter connected with the output of the second mixer.

A surface acoustic wave filter device according to a second invention of the present application is characterized in that it comprises surface acoustic wave (SAW) convolver means consisting of m SAW convolvers, with each of which two input transducers, to each of which an input matching circuit is connected, and an output matching circuit are connected and each of which includes an output electrodes disposed between the input transducers, the output matching circuit of each stage of the SAW convolvers being connected one after another with one of the input matching circuits of a succeeding stage of the SAW convolvers in series; a reference signal generator for supplying a reference signal to another of the input matching circuits of each of the SAW convolvers; (m−1) first mixers for mixing an output of the output matching circuit and the reference signal and (m−1) first low pass filters, each of which is connected with each of the first mixers, each of them being connected between the output matching circuit and the another of the input matching circuits connected in series of each of the SAW convolvers; and a detecting circuit for detecting the output of the output matching circuit of the last stage of the SAW convolvers.

In a surface acoustic wave filter device having the construction described above, when the input signal is applied to one of the input matching circuits of the first convolver and the reference signal is applied to the other of the input matching circuits of each of the SAW convolvers, each of the first mixtures and the second mixer, the output signal E(t) or P(t) is obtained from the second low pass filter or the detecting circuit.

DETAILED DESCRIPTION

Figure 1:
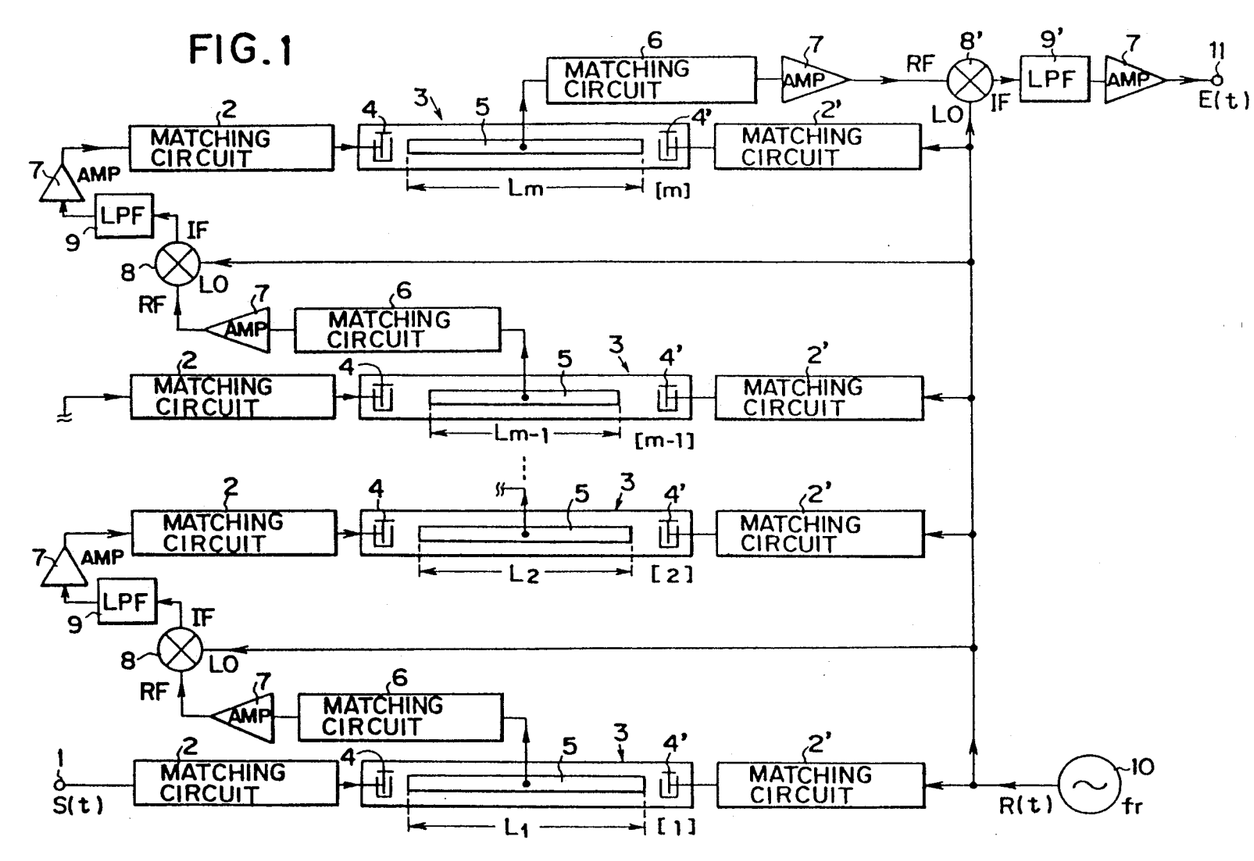
FIG. 1 is a block diagram showing an embodiment of the present invention.
Figure 2:
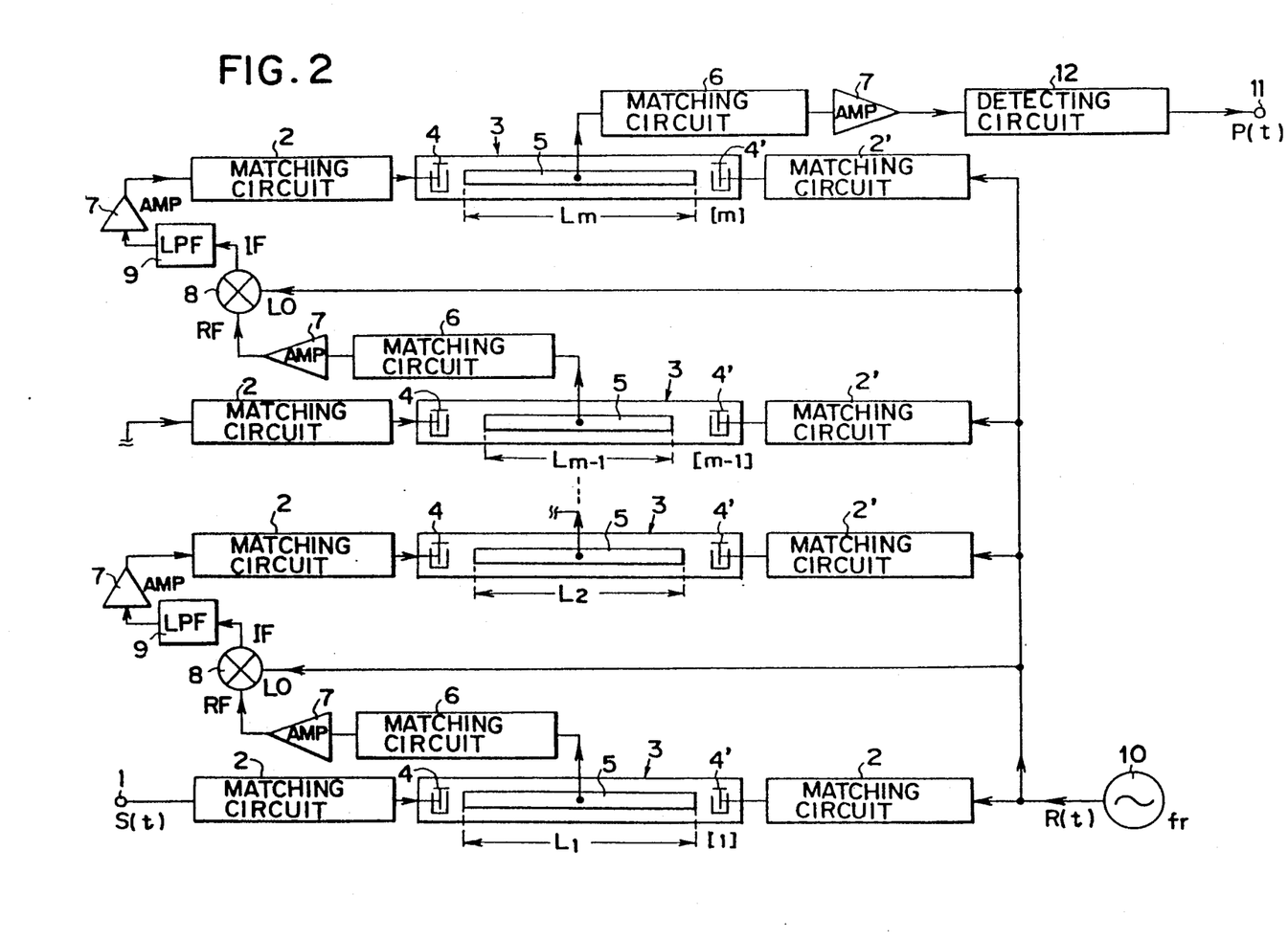
FIG. 2 is a block diagram showing another embodiment of the present invention.

Hereinbelow the embodiments of the present invention indicated in the drawings will be explained. FIGS. 1 and 2 show the embodiments of the present invention, by which the prior art devices indicated in FIGS. 6 and 7 are improved, respectively. In FIGS. 1 and 2, reference numerals identical to those used in FIGS. 6 and 7 represent identical or similar circuits and m (m ≧2) SAW convolvers are used therein.

At first the embodiment indicated in FIG. 1 will be explained.

The embodiment indicated in FIG. 1 is composed basically of m SAW convolvers 3 (m≧2); 2 m input matching circuits 2 and 2′; m output matching circuits 6; (m−1) first mixers 8; a second mixer 8′; (m−1) first low pass filters 9; a second low pass filter 9′; 2 m amplifiers 7; and a reference signal generator 10. Numerals [1], [2], ... [m] in FIG. 1 are numbers affixed to different stages of the SAW convolvers 3. Further $L_1, L_2, \ldots$ and $L_m$ represent gate lengths of the output electrodes of the different convolvers, respectively. Although, in FIG. 1, the connection between the [2]nd convolver and the [m−1]th convolver is omitted, the connection between the [n]th convolver and the [n+1]th convolver (2≦n, n+1≦m−1) is identical to the connection between the [1]st convolver and the [2]nd convolver.

The different constituent elements have characteristics and are connected as described below, where the frequency band of the input transducers 4, 4′ of the different convolvers is denoted by $f_L \sim f_H$ ($f_L < f_H$) and the frequency of the reference signal R(t) outputted by the reference signal generator 10 by $f_r$.

(a) The frequency domain matched by the matching circuit 6 of each of the convolvers is $2 f_L \sim 2 f_H$.

(b) $f_L \leq f_r \leq f_H$ (c) The cut-off frequency of the different low pass filters 9 and 9′ is $f_H$ (the filters make the frequences below $f_H$ pass through).

(d) The input transducers S(t) is inputted in one of the input transducers 4 of the [1]st convolver 3, while the reference signal R(t) is inputted in the other of the input transducers 4′ of the [1]st convolver 3.

Figure 3:
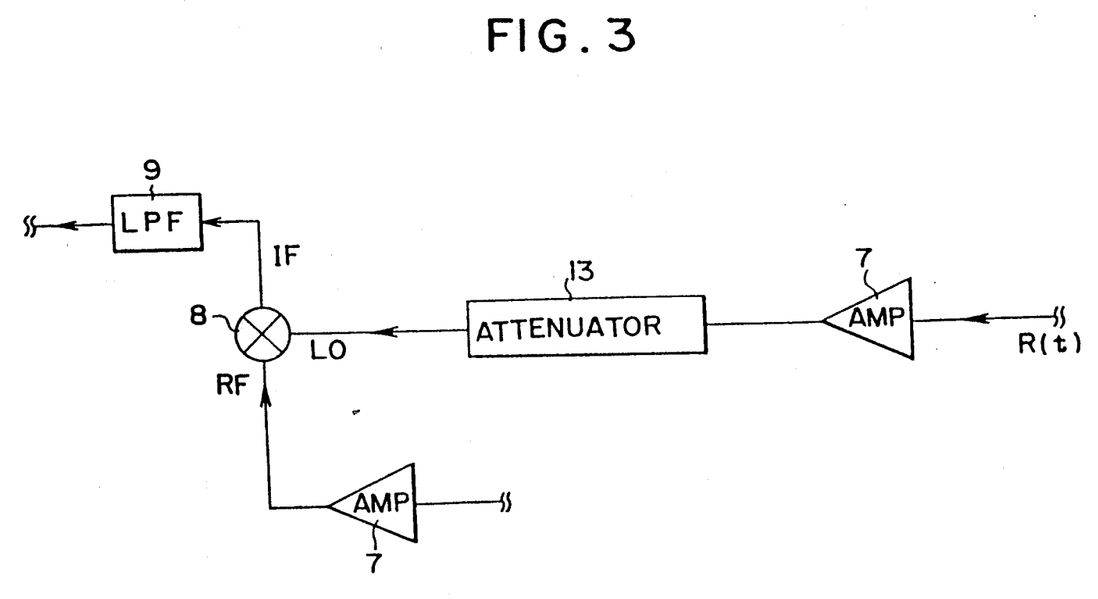
FIG. 3 is a block diagram showing an example of construction for regulating the level of the reference signal inputted in an LO terminal of the mixer in the embodiment indicated in FIG. 1.

(e) The reference signal R(t) is inputted not only in the other inputs of the input transducers of the remaining (m−1) convolvers but also the (m−1) first mixers 8 and and LO (Local) terminal of the second mixer 8′. Here, when the reference signal is inputted in the mixers, as indicated in FIG. 3, an attenuator 13 and an amplifier 7 or either one of them may be disposed before the LO terminal of each of the mixers 8 for the level regulation. In this case, the number of amplifiers 7 in FIG. 1 can be greater than 2 m. Further attenuators can be added to the constituent elements.

(f) The signal outputted by the output matching circuit 6 of the [1]st convolver is inputted in the RF terminal of the mixers 8 after having been amplified by the amplifiers 7. As indicated in Item (e), the reference signal is inputted in the LO terminals of the mixers and the output from the IF terminal, which is the other terminal of each of the mixers, passes through a low pass filter 9 indicated in Item (c) and is inputted in the one of the input transducers of the [2]nd convolver 3 through the amplifier 7 (however this transducer is different from the transducer, in which the reference signal indicated in Item (e) is inputted).

(g) In the case where m≧3, the output of the output matching circuit 6 of the [2]nd convolver 3 is also inputted in the one of the input transducers of the [3]rd convolver 3 by connecting it with the constituent elements similar to those indicated in Item (f). This is repeated in the following and the output of the output matching circuit 6 of the [n]th convolver is connected similarly with the one of the input transducers of the [n+1]th convolver, where n+1≦m.

(h) The output from the output matching circuit 6 of the [m]th convolver 3 is inputted in the RF terminal of the second mixer 8′ after having been amplified by the amplifier 7 (the reference signal is inputted in the LO terminal of the mixer). The output from the IF terminal of the mixer 8' is made pass through the second low pass filter 9' and is amplified through the amplifier 7. The output of the amplifier is the output E(t) of the whole device.

Now the embodiment indicated in FIG. 2 will be explained. The embodiment indicated in FIG. 2 differs from that indicated in FIG. 1 only in how to take out the output of the [m]th convolver 3. The output of the [m]th convolver 3 is made pass through the output matching circuit 6 and the amplifier 7 and then detected by the detecting circuit 12 without passing through the second mixer 8' as in FIG. 1. The output of this detecting circuit is the output P(t) of the whole device. Here the detecting circuit 12 is such a detecting circuit that it outputs a signal proporational to the amplitude of the input signal.

Consequently the characteristics and the connection of the constituent elements in FIG. 2 are completely identical to those indicated in Items (a) to (g) in the explanation for FIG. 1. However, since how to take out the output of the [m]th convolver 3 in FIG. 2 differs from that indicated in FIG. 1, as described previously, what is described in Item (h) for FIG. 1 is not valid for FIG. 2.

From the above description the constituent elements in FIG. 2 are basically m convolvers 3 (m≧2); 2 m input matchig circuit 2, 2'; m output matching circuit 6; (m−1) first low pass filters 9; (2 m−1) amplifiers 7; (m−1) first mixers 8; one reference signal generator 10; and one detecting circuit 12. However, as indicated in Item (e) in the explanation for FIG. 1, in the case where an attenuator and an amplifier for the level regulation are disposed before the LO terminal of the mixer 8, as indicated in FIG. 3, the number of amplifiers 7 in FIG. 2 can be greater than 2 m−1 and attenuators can be added to the constituent elements.

Next the reason why the drawbacks of the prior art devices indicated in FIGS. 6 and 7 are removed by the embodiments of the present invention described above and indicated in FIG. 1 and 2 will be explained.

In the embodiments indicated in FIGS. 1 and 2, when a sinusoidal wave given by Eq. (3) stated previously is inputted as the reference signal R(t) and another sinusoidal wave given by Eq. (6) stated previously is inputted as the input signal S(t), the output E(t) in FIG. 1 and the output P(t) in FIG. 2 can be expressed as follows;

$$E(t) = \frac{A_0 S_0 R_0^{2m}}{\{\pi \cdot (f - f_r)\}^m} \cdot \sin\{\pi(f - f_r)T_1\} \cdot \sin\{\pi(f - f_r)T_2\} \times \qquad (14)$$

$$\sin\{\pi(f - f_r)T_3\} \cdot \ldots \cdot \sin\{\pi(f - f_r)T_{m-1}\} \cdot \sin\{\pi(f - f_r)T_m\} \times$$

$$\cos\left\{2\pi f\left(t - \frac{T_1 + T_2 + \ldots + T_m}{2}\right) + \theta(f) + \theta_r\right\}$$

$$P(t) = \left| \frac{B_0 S_0 R_0^{2m-1}}{\{\pi \cdot (f - f_r)\}^m} \cdot \sin\{\pi(f - f_r)T_1\} \cdot \sin\{\pi(f - f_r)T_2\} \times \right. \qquad (15)$$

$$\left. \sin\{\pi(f - f_r)T_3\} \cdot \ldots \cdot \sin\{\pi(f - f_r)T_{m-1}\} \cdot \sin\{\pi(f - f_r)T_m\} \right|$$

where $$T_n = \frac{L_n}{v} \qquad (n = 1, 2, \ldots m) \qquad (16)$$

and v represents the propagation velocity of the surface acoustic wave on the SAW convolvers 3. $T_n$ is equal to the gate delay time of the [n]th convolver.

In Eq. (14), $A_o$ is a constant determined by the efficiency of the convolvers 3, the gain of the amplifiers 7 and the efficiency of the mixers 8 and $\theta(f)$ represents an amount of phase shift determined by phase characteristics of the input and the output matching circuits 2, 2' and 6, the amplifiers 7, the mixers 8 and the low pass filters 9.

On the other hand, in Eq. (8), $B_o$ is a constant determined by the efficiency of the convolvers 3, the gain of the amplifiers 7 and the efficiency of the detecting circuit 12.

From Eqs. (14) and (15), it can be understood that the amplitude characteristics $|E(t)|$ of the filter indicated in FIG. 1 and the output P(t) of the circuit indicated in FIG. 2 are proportional to a following function;

$$\left. \begin{array}{c} |E(t)| \\ P(t) \end{array} \right\} \propto \qquad (17)$$

$$\left| \frac{\sin\{\pi(f - f_r)T_1\} \cdot \sin\{\pi(f - f_r)T_2\} \ldots \sin\{\pi(f - f_r)T_m\}}{\{\pi \cdot (f - f_r)\}^m} \right|$$

As an example, if all the gate lengths $L_1$ to $L_m$ of the different convolvers 3 are equal to each other, putting;

$$\begin{cases} L_1 = L_2 = \ldots = L_m \equiv L & (18) \\ T \equiv \frac{L}{v}, & (19) \end{cases}$$

$$\left. \begin{array}{c} |E(t)| \\ P(t) \end{array} \right\} \propto \left| \frac{\sin\{\pi(f - f_r)T\}}{\{\pi \cdot (f - f_r)\}} \right|^m \qquad (20)$$

At this time, it is clear that the construction indicated in FIG. 1 is a band pass filter having a central frequency $f_r$ as that indicated in FIG. 6. On the other hand, in the construction indicated in FIG. 2 there remains only the main lobe and it can be applied to a spectrum analyzer or an AM or FM demodulator as that indicated in FIG. 7.

As described above, if all the gate lengths of the different convolvers are equal to each other, the ratio $V_{smax}/V_p$ fo the maximum value $V_{smax}$ of the side lobes to the peak value $V_P$ of the main lobe takes values as indicated below, depending on the number of convolvers m.

TABLE 1

| Level of side lobes, when all gate lengths are equal to each other | |
|---|---|
| Number of side lobes m | Level of side lobes (relative value) $V_{smax}/V_p$ |
| 1 (prior art) | −13.26 dB |
| 2 | −26.52 dB |
| 3 | −39.78 dB |
| 4 | −54.04 dB |
| M | −13.26 × M dB |

As clearly seen from TABLE 1, it is possible to lower the level of the side lobes by using the construction indicated in FIGS 1 and 2 according to the present invention with respect to that obtained by the prior art devices and thus to remove the drawbacks of the prior art constructions.

Although, in the examples described above, all the gate lengths of the different convolver 3 are equal to each other, they are not necessarily equal to each other. The level of the side lobes can be made lower with different gate lengths rather than with an equal gate length. In this meaning, according to the present invention, the gate lengths are not limited to those defined by the condition expressed by Eq. (18).

As an example, in the case where the number of convolvers is 2 (m=2), it will be explained below how the level of the side lobes is varied, depending on the gate length.

Figure 4A:
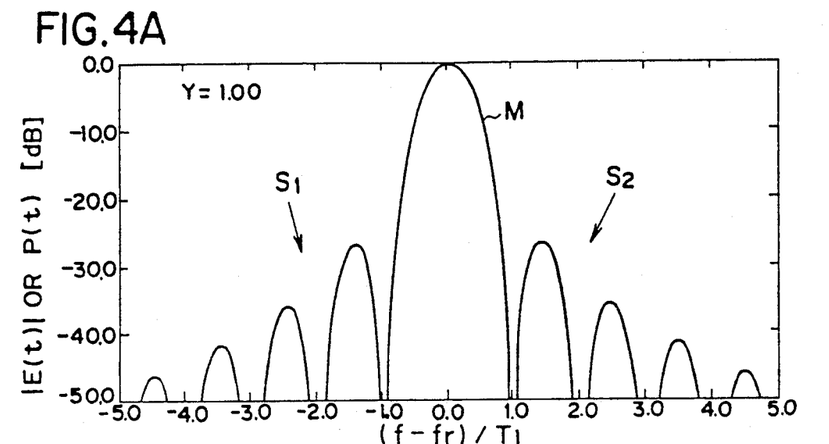
FIGS. 4A, 4B and 4C indicate frequency characteristics of the output, in the case where two convolvers are used according to the present invention.
Figure 4B:
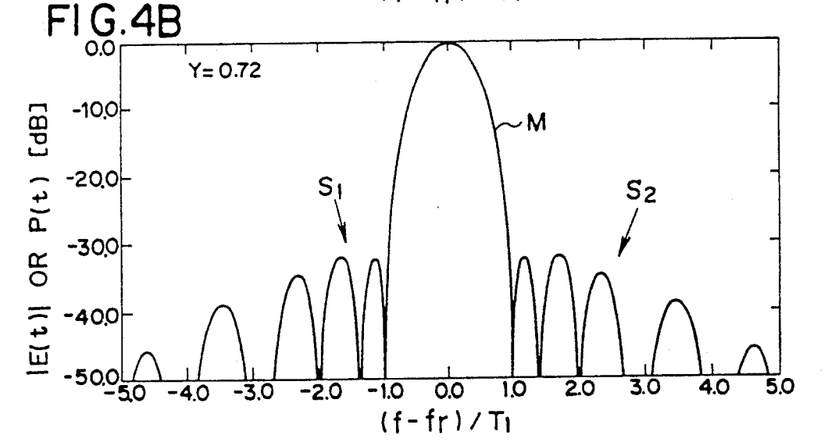
Figure 4C:
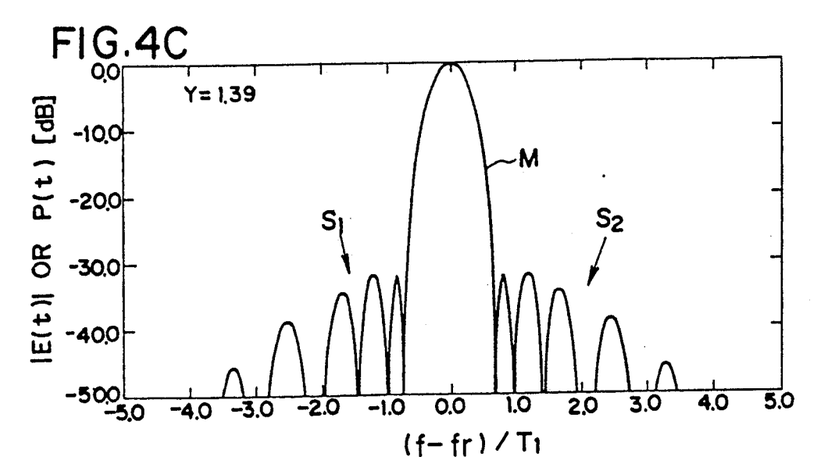

Now, denoting the ratio of the gate length $L_2$ of the second convolver 3 to the gate length $L_1$ of the first convolver 3 by;

$$Y = \frac{L_2}{L_1}, \tag{21}$$

how the amplitude characteristics $|E(t)|$ of the filter indicated in FIG. 1 and the frequency characteristics of the output $P(t)$ of the construction indicated in FIG. 2 vary is calculated for Y=1, Y=0.72 and Y=1.39, and results thus obtained are indicated in FIGS. 4(*a*), 4(*b*) and 4(*c*). The abscissa of these figures represents $(f-f_r)/T_1$ and the ordinate indicates the value normalized with respect to the maximum value of $|E(t)|$ or $P(t)$. Here $T_1$ represents the gate delay time of the convolver 1, as given by Eq. (16).

As it can be understood from FIGS. 4(*a*), 4(*b*) and 4(*c*), when 2 convolvers are used, the maximum value of the level of the side lobes $S_1$ and $S_2$ is smaller in the case where the gate lengths are different than in the case where they are equal (Y=1). Therefore it is calculated how the maximum value of the side lobes depends on the gate length ratio $Y=L_2/L_1$, in the case where 2 convolvers are used (m=2) according to the present invention, and results thus obtained are indicated in FIG. 5.

Figure 5:
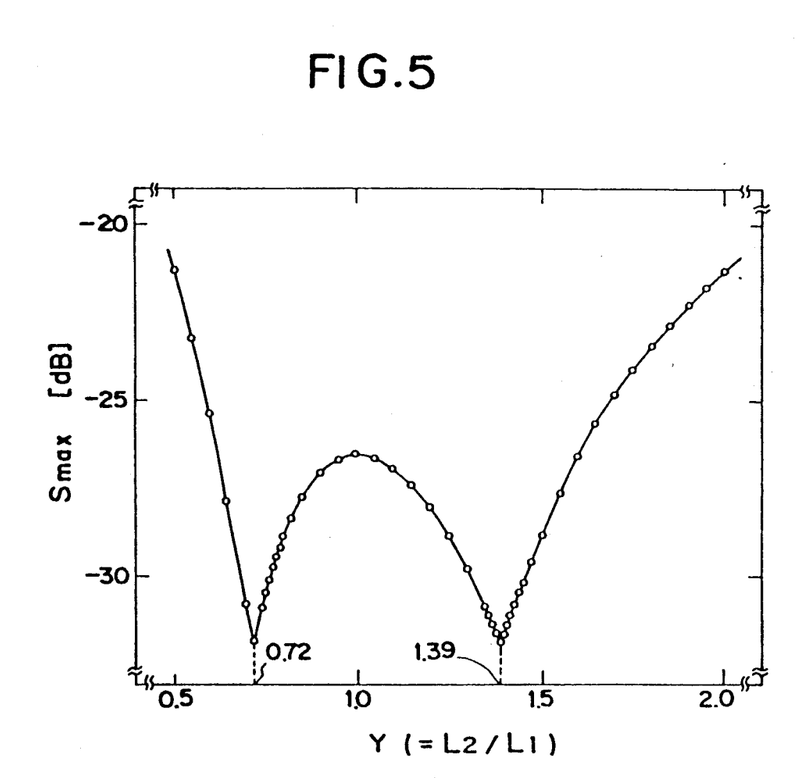
FIG. 5 indicates the relation between the gate length ratio and the highest side lobe level, in the case where two convolvers are used according to the present invention.

From FIG. 5 it can be understood that the maximum side lobe level $S_{max}$ depends strongly on the gate length ratio. In particular, the condition, under which the maximum side lobe level is below about $-30$ dB, is expressed by following two regions;

$$\begin{cases} 0.68 \leq Y \leq 0.76 \\ 1.32 \leq Y \leq 1.46 \end{cases}$$

When these regions are expressed in the gate length, following two regions are obtained;

$$\begin{cases} 0.68 L_1 \leq L_2 \leq 0.76 L_1 & (22) \\ 1.32 L_1 \leq L_2 \leq 1.46 L_1 & (23) \end{cases}$$

In the embodiments of the present invention indicated in FIGS. 1 and 2, also from the point of view that the number of parts and electric power consumption it is preferable to choose a condition, under which the number of convolvers 3 is as small as possible and in addition the side lobe level is as low as possible. From this point of view it can be said that Eqs. (22) and (23) express the condition, under which the side lobe level is satisfactorily low, in the case where the smallest number of convolvers, i.e. 2 according to the present invention, are used. In particular, in the case where Y=0.72 or Y=1.39, the maximum side lobe level is about $-31.8$ dB. Thus the side lobe level can be lowered by about 18.5 dB with respect to that obtained by the prior art constructions indicated in FIGS. 6 and 7. However, since the side lobe level can be lowered more than about 17 dB also in the regions expressed by Eqs. (22) and (23), it can be said that these regions are sufficiently useful in practice.

As explained above, according to the present invention, it is possible to reduce the side lobe level with respect to a filter having a variable central frequency or a spectrum analyzer using a prior art SAW convolver. Therefore it is possible to increase further the side lobe suppression ratio of the filter and to enlarge the dynamic range of the spectrum analyzer.

The embodiments of the invention in which an exclusive property or privilege is claimed are defined as follows:

1. A surface acoustic wave filter device comprising:
    surface acoustic wave (SAW) convolver means which includes a plurality m of SAW convolvers each having first and second input transducers and having an output electrode disposed between said input transducers;
    a first input matching circuit and a plurality (m−1) of second input matching circuits each having an output coupled to the first input transducer on a respective one of said convolvers, and a plurality m of third input matching circuits each having an output coupled to the second input transducer on a respective one of said convolvers, an input signal being applied to an input of said first input matching circuit;
    a first output matching circuit and a plurality (m−1) of second output matching circuits each having an input coupled to the output electrode on a respective one of said convolvers;
    a reference signal generator for supplying a reference signal to an input of each of said third input matching circuits;
    a plurality (m−1) of first mixers which each mix an output of a respective one of said second output matching circuits and said reference signal, and a plurality (m−1) of first low pass filters, each having an input coupled with an output of a respective one of said first mixers, and each having an output coupled to an input of a respective one of said second input matching circuits;
    a second mixer for mixing the output of said first output matching circuit and said reference signal; and
    a second low pass filter having an input coupled to an output of said second mixer.

2. A surface acoustic wave filter device according to claim 1, wherein each of said SAW convolvers has a frequency pass band bounded by a lower limit frequency $f_L$ and an upper limit frequency $f_H$, and wherein a frequency domain matched by each said output matching circuit is $2f_L$ to $2f_H$.

3. A surface acoustic wave filter device according to claim 1, wherein each of said SAW convolvers has a frequency pass band bounded by a lower limit frequency $f_L$ and an upper limit frequency $f_H$, and wherein said reference signal has a frequency $f_r$ defined by $f_L \leq f_r \leq f_H$.

4. A surface acoustic wave filter device according to claim 1, wherein each of said SAW convolvers has a frequency pass band bounded by a lower limit frequency $f_L$ and an upper limit frequency $f_H$, and wherein each of said first low pass filters has a cut-off frequency equal to said $f_H$.

5. A surface acousic wave filter device according to claim 1, wherein each of said SAW convolvers has a frequency pass band bounded by a lower limit frequency $f_L$ and an upper limit frequency $f_H$, and wherein the output electrodes of two of said SAW convolvers have lengths of $L_1$ and $L_2$, respectively, where $0.68 L_1 \leq L_2 \leq 0.76 L_1$ or $1.32 L_1 \leq L_2 \leq 1.46 L_1$.

6. A surface acoustic wave filter device comprising:
surface acoustic wave (SAW) convolver means which includes a plurality m of SAW convolvers each having first and second input transducers and having an output electrode disposed between said input transducers;
a first input matching circuit and a plurality (m−1) of second input matching circuits each having an output coupled to the frist input transducer on a respective one of said convolvers, and a plurality m of third input matching circuits each having an output coupled to the second input transducer on a respective one of said convolvers, an input signal being applied to an input of said first input matching circuit;
a first output matching circuit and a plurality (m−1) of second output matching circuits each having an input coupled to the output electrode on a respective one of said convolvers;
a reference signal generator for supplying a reference signal to an input of each of said third input matching circuits;
a plurality (m−1) of first mixers which each mix an output of a respective one of said second output matching circuits and said reference signal, and a plurality (m−1) of first low pass filters each having an input coupled with an output of a respective one of said first mixers, and each having an output coupled to an input of a respective one of said second input matching circuits; and
a detecting circuit having an input coupled to an output of said first output matching circuit.

7. A surface acoustic wave filter device according to claim 6, wherein each of said SAW convolvers has a frequency pass band bounded by a lower limit frequency $f_L$ and an upper limit frequency $f_H$, and wherein a frequency domain matched by each said output matching circuit is $2f_L$ to $2f_H$.

8. A surface acoustic wave filter device according to claim 6, wherein each of said SAW convolvers has a frequency pass band bounded by a lower limit frequency $f_L$ and an upper limit frequency $f_H$, and wherein said reference signal has a frequency $f_r$ defined by $f_L \leq f_r \leq f_H$.

9. A surface acoustic wave filter device according to claim 6, wherein each of said SAW convolvers has a frequency pass band bounded by a lower limit frequency $f_L$ and an upper limit frequency $f_H$, and wherein each of said first low pass filters has a cut-off frequency equal to said $f_H$.

10. A surface acoustic wave filter device according to claim 6, wherein each of said SAW convolvers has a frequency pass band bounded by a lower limit frequency $f_L$ and an upper limit frequency $f_H$, and wherein the output electrodes of two of said SAW convolvers have lengths of $L_1$ and $L_2$, respectively, where $0.68 L_1 \leq L_2 \leq 0.76 L_1$ or $1.32 L_1 \leq L_2 \leq 1.46 L_1$.

* * * * *